United States Patent [19]
Ashizuka et al.

[11] Patent Number: 5,536,358
[45] Date of Patent: Jul. 16, 1996

[54] METHOD OF ESTIMATING ETCHING DAMAGE

[75] Inventors: Kazuaki Ashizuka; Hironobu Miyamoto, both of Tokyo, Japan

[73] Assignee: NEC Corporation, Tokyo, Japan

[21] Appl. No.: 307,236

[22] Filed: Sep. 16, 1994

[30] Foreign Application Priority Data

Sep. 17, 1993 [JP] Japan .................................. 5-230630

[51] Int. Cl.⁶ .................................................. H01L 21/00
[52] U.S. Cl. ........................... 156/626.1; 156/627.1; 156/643.1; 216/59; 216/61
[58] Field of Search .......................... 156/626.1, 627.1, 156/643.1, 657.1, 662.1; 216/59, 61; 437/8, 126, 234

[56] References Cited

U.S. PATENT DOCUMENTS 4,510,674  4/1985  Izu et al. ............................ 156/627.1 X

FOREIGN PATENT DOCUMENTS 3-126243  5/1991  Japan .

*Primary Examiner*—William Powell
*Attorney, Agent, or Firm*—Popham, Haik, Schnobrich & Kaufman, Ltd.

[57] ABSTRACT

The invention provides a method of estimating damage which a semiconductor substrate has suffered in a dry etching step included in a semiconductor fabricating step. The invention includes the steps of forming a delta-doped donor layer at a predetermined depth measuring from a surface of the semiconductor, measuring electron concentrations of the semiconductor before and after the dry etching step, and calculating a difference between the delta-doped donor concentrations to thereby quantitatively estimate a distribution of the damage throughout the depth of the semiconductor.

8 Claims, 5 Drawing Sheets

METHOD OF ESTIMATING ETCHING DAMAGE

BACKGROUND OF THE INVENTION

1. Field of the Invention

The invention relates to a method for estimating damage which a semiconductor device including a chemical compound such as GaAs had suffered due to dry etching.

2. Description of the Related Art

Damage which a semiconductor has suffered throughout a depth thereof due to dry etching has conventionally been estimated with a method utilizing a capacity versus voltage property of a semiconductor (hereinafter, referred to as "C-V method"). FIG. 1 shows a device used for carrying out the C-V method. The device comprises a half-insulating GaAs substrate 1, a GaAs acting layer 6 deposited on the GaAs substrate 1, a Shottky electrode 7 composed of Al or Pd and formed on the GaAs acting layer 6, an ohmic electrode 8 formed on the GaAs acting layer 6, and a voltage supply 10 connected both to the Shottky electrode 7 and the ohmic electrode 8. The Shottky electrode 7 and the ohmic electrode 8 are formed after the GaAs acting layer 6 has been dry etched. The voltage supply 10 applies a certain voltage across the Shottky electrode 7 and the ohmic electrode 8 to thereby measure a concentration of carriers included in the GaAs acting layer 6. In the C-V method, the formation of the Shottky electrode 7 widens a surface depletion layer. For instance, when a concentration of an acting layer of a generally used GaAs FET is $1 \times 10^{17}$ cm$^{-3}$, the surface depletion layer has a depth of about 1000 angstroms. Accordingly, it is impossible to estimate damage that is shallower than 1000 angstroms from a surface.

Japanese Unexamined Patent Public Disclosure No. 3-126243, which was published on May 29, 1991 in Japan, has suggested a method for measuring damage which a semiconductor has suffered throughout a depth thereof due to dry etching. In this method, a damaged layer is removed by etching, and then a lifetime of excess minority carriers of a semiconductor substrate is measured by a method in which a micro wave detecting ray is conductively attenuated.

In the C-V method, charged particles are radiated over a surface of a GaAs substrate during dry etching to damage the substrate to thereby decrease the number of carriers in the vicinity of the surface, and hence a depletion layer is widened. Thus, the C-V method has a defect that it is quite difficult to measure the concentration of carriers present shallower than 1000 angstroms measuring from a surface if a concentration of an acting layer is that of a generally used GaAs FET, for instance, $2.0 \times 10^{17}$ cm$^{-3}$.

In the latter mentioned method suggested in Japanese Unexamined Patent Public Disclosure No. 3-126243, a damaged layer damaged due to dry etching is first removed by etching with high accuracy without a further damage, and then an oxide layer is formed on a surface on which the damaged layer used to exist. This method can provide data relating to how deep damage penetrates into a substrate. However, it is impossible by this method to estimate distribution of damage throughout a depth of a substrate. In addition, the method exhibits a problem in that the degree of damage may be changed due to the removal of a damaged layer by etching before measurement of damage, and also due to the formation of an oxide layer.

SUMMARY OF THE INVENTION

In view of the foregoing problems which the conventional methods have, it is an object of the present invention to provide method for quantitatively estimating a damage which GaAs substrate suffered throughout a depth thereof due to dry etching to thereby enable to quantitatively and accurately know influences which the damage causes to a semiconductor device.

The invention provides a method of estimating damage which a semiconductor substrate has suffered in a dry etching step included in a semiconductor fabricating step. The method includes the steps of forming a delta-doped donor layer at a predetermined depth measuring from a surface of the semiconductor, measuring electron concentrations of the semiconductor before and after dry etching, and calculating a difference between the delta-doped donor concentrations to thereby quantitatively estimate a distribution of the damage, which passivates donors, throughout the depth of the semiconductor.

The predetermined depth may range from about 200 angstroms to about 1500 angstroms.

In a preferred embodiment, the semiconductor has a GaAs substrate, an undoped GaAs layer deposited on the GaAs substrate, and an undoped AlGaAs layer deposited on the undoped GaAs layer, and the delta-doped donor layer is formed in the undoped AlGaAs layer.

In another preferred embodiment, the semiconductor has a GaAs substrate and an undoped GaAs layer deposited on the GaAs substrate, and the delta-doped donor layer is formed in the undoped GaAs layer.

In still another preferred embodiment, the delta-doped donor layer is a silicon delta-doped donor layer.

The advantages obtained by the aforementioned present invention will be described hereinbelow.

In accordance with the invention, it is possible to estimate the degree of the damage and the distribution of the damage throughout a depth of a semiconductor in a region shallower than 1000 angstroms from a surface of the semiconductor by using a delta-doped structure. In particular, it is possible to exactly estimate the influences which the damage passivates delta-doped donors, which determines a performance of the semiconductor, located at a depth ranging from 200 to 1500 angstroms measuring from a surface thereof.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to the drawings.

Figure 2:
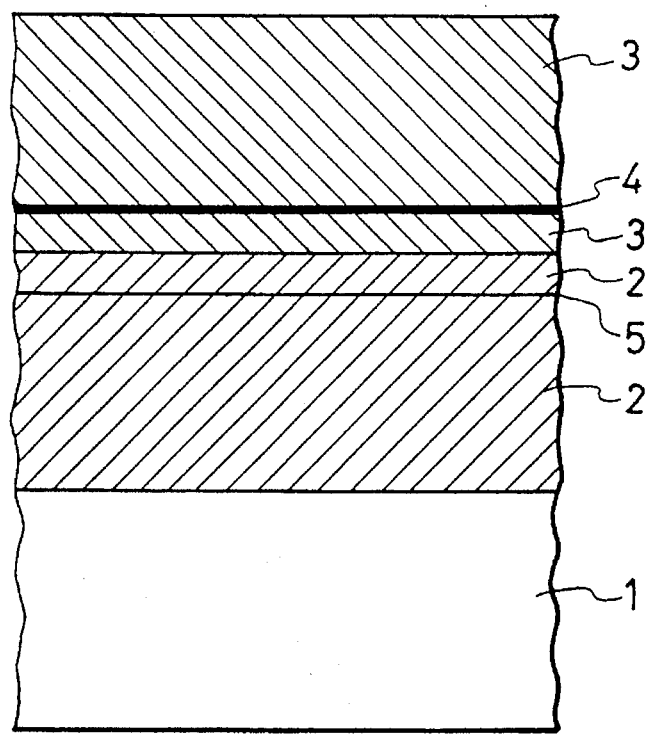
FIG. 2 is a cross-sectional view illustrating delta-doped structure used for estimating a damage in accordance with first embodiment of the present invention.

FIG. 2 is a cross-sectional view illustrating a delta-doped structure used for estimating damage in accordance with a first embodiment of the present invention. As illustrated, on a half-insulating GaAs substrate 1 is grown an undoped GaAs layer 2 having 5000 angstroms of thickness by a molecular beam epitaxy (MBE) process, and then an undoped AlGaAs layer 3 is deposited on the GaAs layer 2. A silicon delta-doped AlGaAs layer 4 is formed by silicon delta-doping the AlGaAs layer 3 at a depth at which a damage is intended to be estimated. The depth at which the delta-doped AlGaAs layer 3 is formed may range from 200 angstroms to 1500 angstroms. In the first embodiment, there are used for heterojunction structures ($Al_{0.3}Ga_{0.7}$ As/GaAs) in which the depth from a surface of the AlGaAs layer 3 to the delta-doped donor layer 4 is each 200, 300, 500, 700, 900 and 1500 angstroms. By arranging the doping concentration Nd of the delta-doped donor layer 4 to range from $2.8 \times 10^{12}$ to $4.2 \times 10^{12}$ $cm^{-2}$, the concentration Ns of two-dimensional electron gas of a two-dimensional electron gas layer 5 existing at a hetero-interface is arranged to range from $0.9 \times 10^{12}$ to $1 \times 10^{12}$ $cm^{-2}$. The concentration Ns is calculated by the following equation (A).

$$Ns = \epsilon_s(q \times Nd \times d/\epsilon_s - \phi_s + \Delta Ec - E_F)/q(d+d_1) \quad (A)$$

wherein

Ns represents a concentration of two-dimensional electron gas, $\epsilon_s$ represents permitivity of AlGaAs, q represents an elementary charge, d represents depth from a surface to the delta-doped layer, $d_1$ represents depth from a surface to the AlGaAs/GaAs interface, Nd represents a doping concentration of the delta-doped layer, $\phi_s$ represents a surface potential on AlGaAs, $\Delta Ec$ represents discontinuity in the conduction band at AlGaAs/GaAs interface, and $E_F$ represents a Fermi level at the interface relative to the GaAs conduction band.

In the above mentioned equation (A), two damage estimating are assumed. First, with respect to the damage on the AlGaAs surface, the damage includes negative charge on the surface. The negative charge increases the surface potential $\phi_s$, and the concentration of two-dimensional electron gas Ns decreases with an increase of the surface potential $\phi_s$. Second, with respect to the damage in the AlGaAs, the damage passivates delta-doped donor. The delta-doped donor decreases the doping concentration of the delta-doped layer Nd. The concentration of two-dimensional electron gas Ns decreases with an decrease of the doping concentration of the delta-doped layer Nd.

Figure 3:
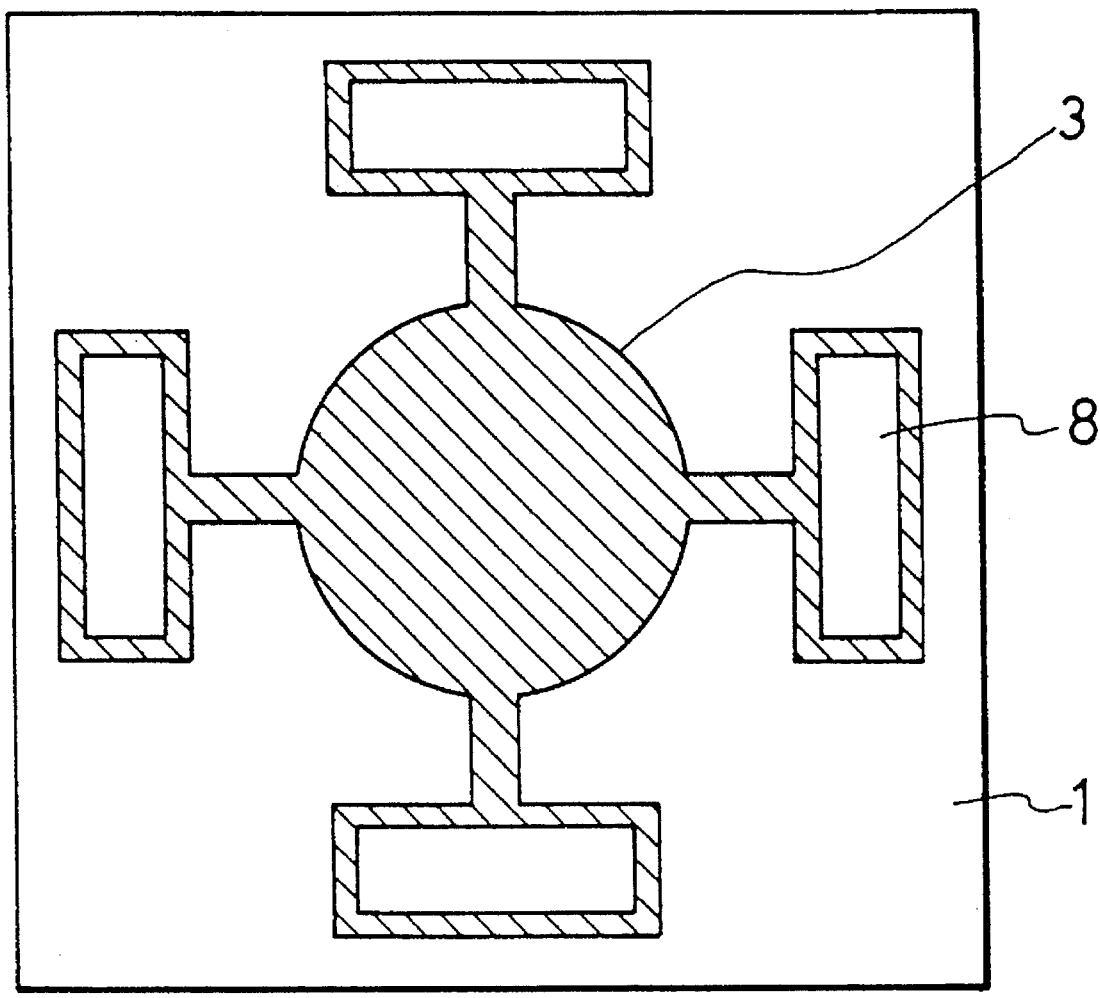
FIG. 3 is a plan view illustrating an element for estimating a damage, used in the first embodiment.
Figure 4:
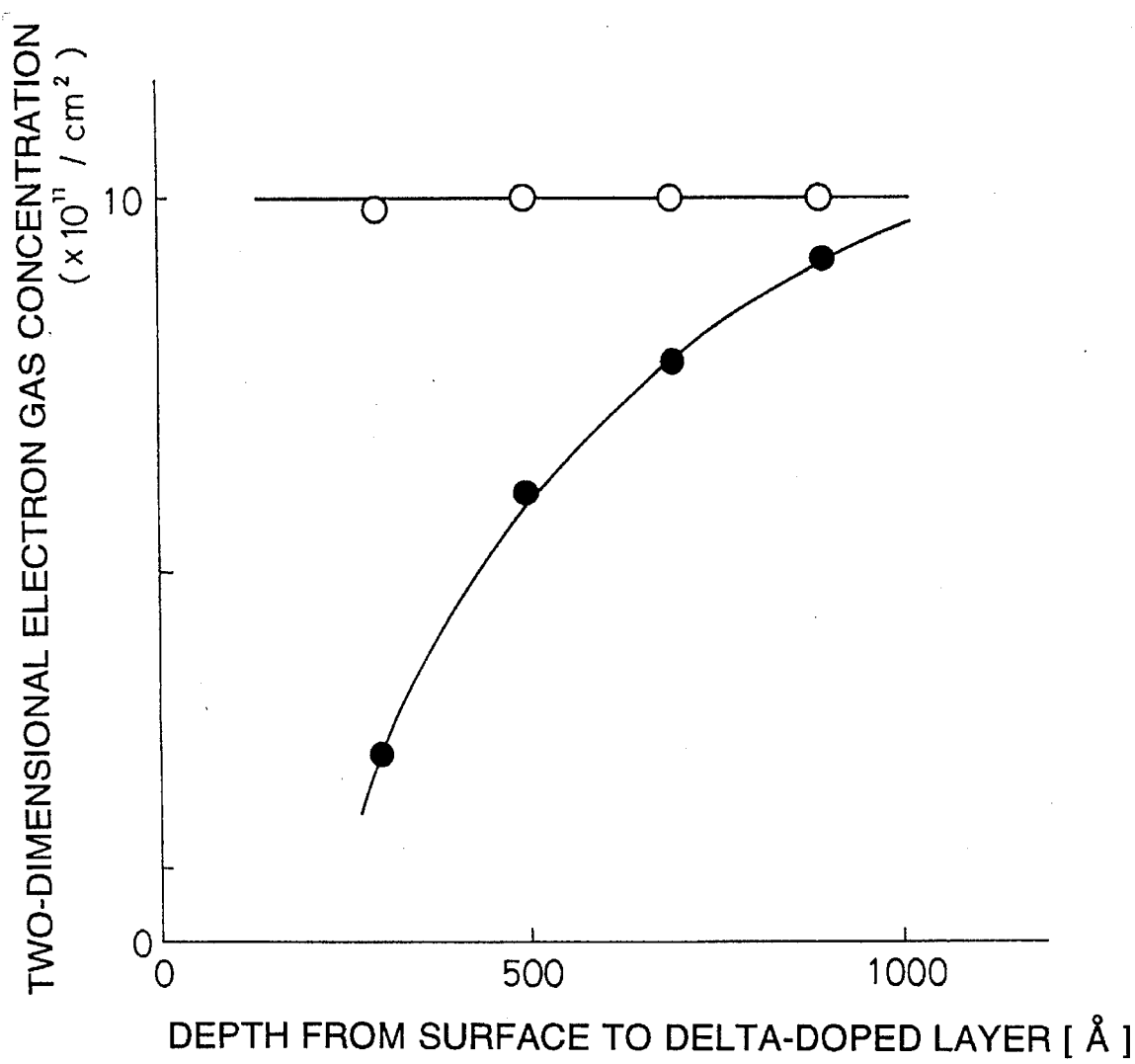
FIG. 4 is a graph showing data for measuring electron concentrations of the semiconductor before and after dry etching.

An element as illustrated in FIG. 3 for estimating a damage is fabricated. The element comprises an electrode 8 made of AuGe/Ni/Au metal, and a portion in which the undoped AlGaAs layer 3 is exposed to be damaged due to dry etching. The estimation is carried out in accordance with following steps 1 to 5.

Step 1: Before dry etching, the concentration of two-dimensional electron gas of the element is measured. The measured value is used as a standard data.

Step 2: The element is dry etched.

Step 3: The dry etched element is measured without any post-treatments with respect to the concentration of two-dimensional electron gas.

Figure 1:
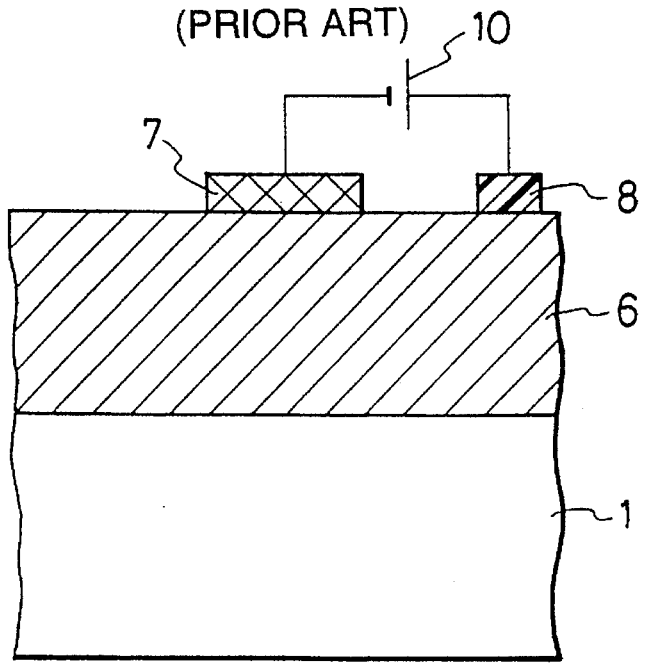
FIG. 1 is a schematic view illustrating a conventional method for estimating damage of a semiconductor.

Step 4: First, a sample in which the delta-doped layer 3 is present at 1500 angstroms of the depth is dry-etched, and then a decrement of the concentration of two-dimensional electron gas Ns of the dry-etched sample is calculated. Then, an increment of the surface potential on AlGaAs $\phi_s$ due to the negative charge is estimated with the equation (A). It is concurrently confirmed that the damage in AlGaAs does not reach 1500 angstroms by means of the C-V process explained with reference to FIG. 1.

Step 5: With respect to a sample in which the delta-doped layer 3 is present at the depth shallower than 1500 angstroms, a decrement of the doping concentration of the delta-doped layer Nd caused by the damage is calculated with the equation (A) based on the surface potential on AlGaAs $\phi_s$ obtained in Step 3 and the decrement of the concentration of two-dimensional electron gas Ns. The thus calculated decrement of Nd is the damage.

Figure 5:
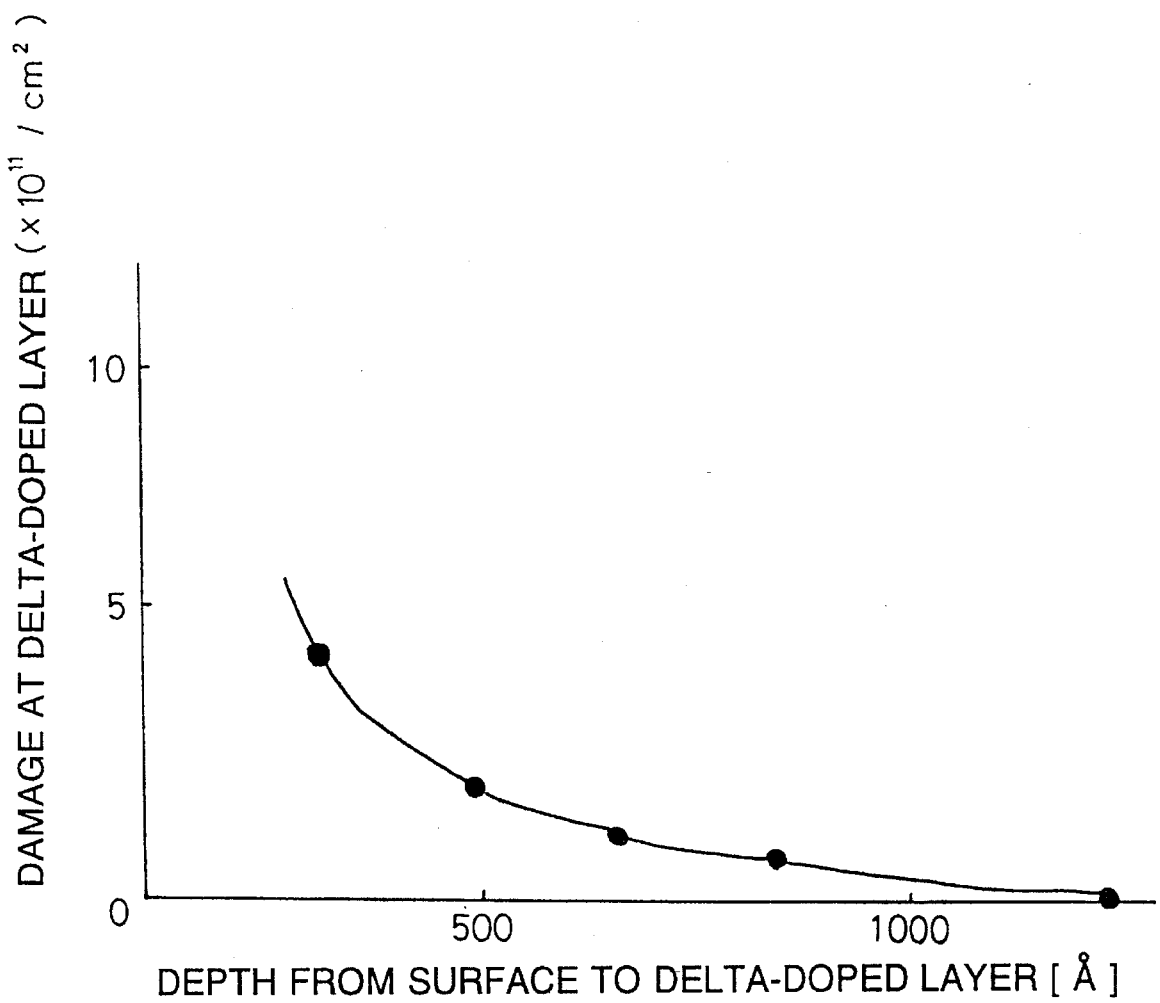
FIG. 5 is a graph showing data for estimating a damage.

The decreased concentration between the values measured in steps 1 and 3 is an estimated value of a damage due to dry etching. FIG. 5 shows the measured values in steps 1 and 3 in the embodiment. The measurement was performed using an ECR dry etching apparatus under the following conditions:

Power of microwave: 170 W $SF_6$: $7 \times 10^{-4}$ Torr

RF bias voltage to be applied to a substrate: 40 W

Sheath voltage: $-7$ V

The microwaves were radiated for 2 minutes. Thus, it is possible to estimate the decreased quantity of the electron concentration due to a damage in the vicinity of a surface, that is, a damage in a region at a depth ranging between 200 and 900 angstroms from a surface, which damage could not be measured in conventional methods. Hence, by measuring a dependency of the decreased quantity of the two-dimensional electron gas concentration on process parameters such as RF power, a period of time for etching and a period of time for plasma radiating, it is possible to exactly measure the same damage at each depth as that of an actual element to thereby enable to quantitatively and exactly measure influences which the damage causes to an element.

Figure 6:
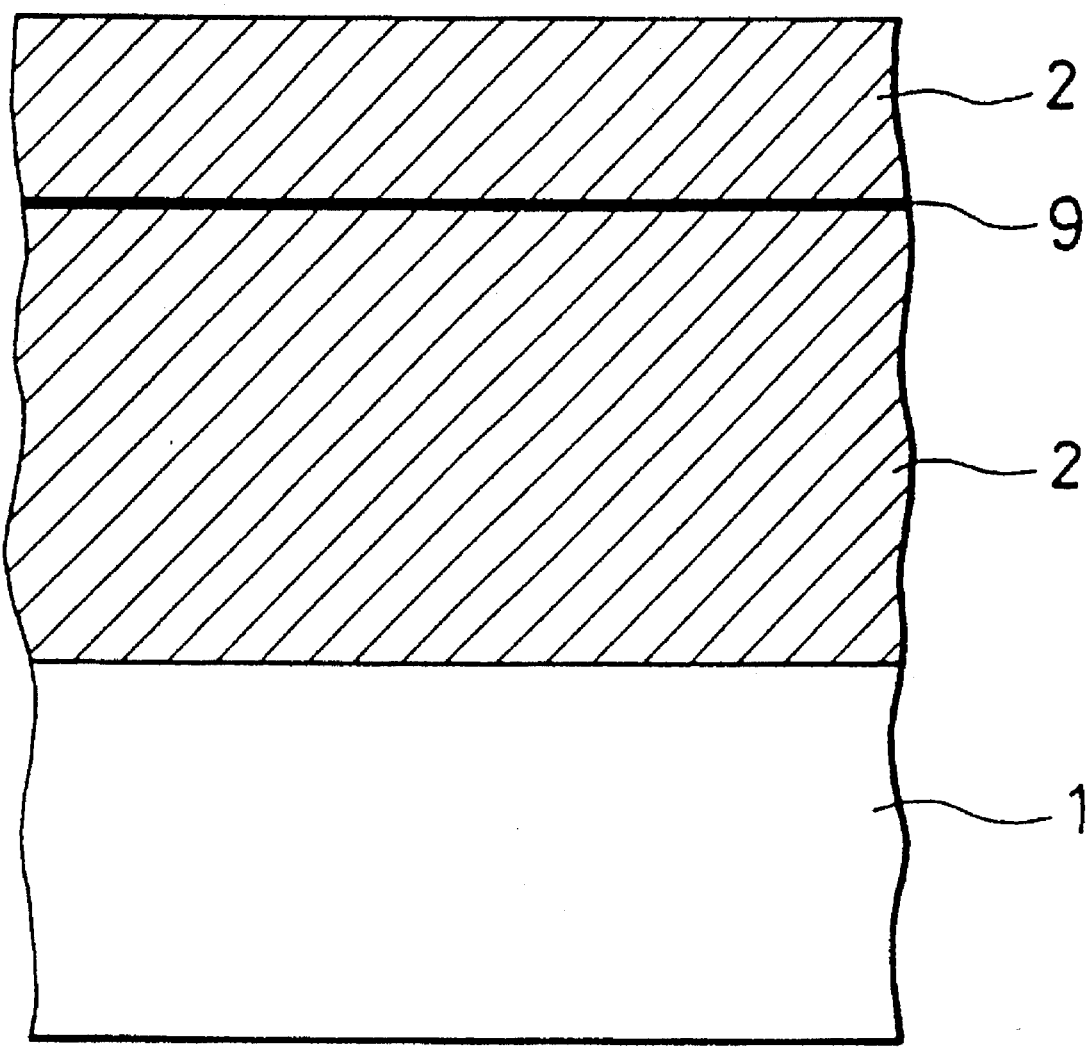
FIG. 6 is a cross-sectional view illustrating a delta-doped structure used for estimating damage in accordance with a second embodiment of the present invention.

FIG. 6 illustrates a second embodiment in accordance with the present invention. First, on a half-insulating GaAs substrate 1 is developed an undoped GaAs layer 2 having 5000 angstroms of thickness by molecular beam epitaxy (IvlBE) process. A silicon delta-doped GaAs layer 9 is formed by silicon delta-doping the GaAs layer 2 at a depth at which a damage is intended to be estimated. In the second embodiment, the silicon delta-doped donor layer 9 is formed in each doped structure at a depth of 200, 400, 600, 800 and 1500 angstroms from a surface of the undoped GaAs layer 2. The doping concentration Nd is arranged to be $4.0 \times 10^{12}$ $cm^{-2}$ and $5 \times 10^{12}$ $cm^{-2}$. The second embodiment has a simpler crystal structure than the first embodiment because the second embodiment does not include the two-dimensional electron gas layer 5 unlike the first embodiment. Accordingly, in the second embodiment the concentration of two-dimensional electron gas Ns is calculated with the following equation (B).

$$Ns = Nd - \phi_s \times \epsilon_s/q \times d \quad (B)$$

The second embodiment also has an advantage that the second embodiment can directly estimate actual influences caused by a damage to a MESFET element because the second embodiment has the same crystal structure as that of a generally used GaAs MESFET element.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of estimating damage which a semiconductor substrate has suffered during a dry etching step which is included in a semiconductor fabricating step, said method comprising the steps of:

forming a delta-doped donor layer under a surface of the semiconductor;

measuring electron concentrations of the semiconductor before and after the dry etching step; and calculating the difference between the delta-doped donor concentrations to quantitatively estimate the distribution of the damage throughout the depth of the semiconductor.

2. A method in accordance with claim 1, wherein the delta-doped donor layer is formed under the surface of the semiconductor at a depth ranging from about 200 angstroms to about 1500 angstroms.

3. A method in accordance with claim 1, wherein the delta-doped donor layer is formed under the surface of the semiconductor at a depth ranging from about 300 angstroms to about 1000 angstroms.

4. A method in accordance with claim 1, wherein the semiconductor comprises a GaAs substrate, an undoped GaAs layer deposited on the GaAs substrate, and an undoped AlGaAs layer deposited on the undoped GaAs layer, the delta-doped donor layer being formed in the undoped AlGaAs layer.

5. A method in accordance with claim 4, wherein the delta-doped layer is formed in the undoped AlGaAs layer at a depth ranging from about 300 angstroms to about 1500 angstroms.

6. A method in accordance with claim 1, wherein the semiconductor comprises a GaAs substrate, and an undoped GaAs layer deposited on the GaAs substrate, the delta-doped donor layer being formed in the undoped GaAs layer.

7. A method in accordance with claim 6, wherein the delta-doped donor layer is formed in said undoped GaAs layer at a depth ranging from about 200 angstroms to about 800 angstroms.

8. A method in accordance with claim 6, wherein the delta-doped donor layer comprises a silicon delta-doped donor layer.

* * * * *